(12) United States Patent
Rodenbeck et al.

(10) Patent No.: US 9,013,046 B1
(45) Date of Patent: Apr. 21, 2015

(54) PROTECTING INTEGRATED CIRCUITS FROM EXCESSIVE CHARGE ACCUMULATION DURING PLASMA CLEANING OF MULTICHIP MODULES

(71) Applicants: Sandia Corporation, Albuquerque, NM (US); Honeywell Federal Manufacturing & Technologies, LLC, Kansas City, MO (US)

(72) Inventors: Christopher T. Rodenbeck, Albuquerque, NM (US); Michael Girardi, Overland Park, KS (US)

(73) Assignees: Sandia Corporation, Albuquerque, NM (US); Honeywell Federal Manufacturing & Technologies, LLC, Kansas City, KS (US)

( * ) Notice: Subject to any disclaimer, the term of this patent is extended or adjusted under 35 U.S.C. 154(b) by 119 days.

(21) Appl. No.: 13/945,074

(22) Filed: Jul. 18, 2013

Related U.S. Application Data

(60) Provisional application No. 61/673,388, filed on Jul. 19, 2012.

(51) Int. Cl.
*H01L 21/56* (2006.01)
*H01L 23/00* (2006.01)

(52) U.S. Cl.
CPC ............... *H01L 24/03* (2013.01); *H01L 24/02* (2013.01)

(58) Field of Classification Search
CPC ........................................................ H01L 21/56
USPC .......... 438/109, 118, 121, 127; 257/676, 702, 257/783, 784
See application file for complete search history.

(56) References Cited

U.S. PATENT DOCUMENTS

| | | | | |
|---|---|---|---|---|
| 5,350,710 | A * | 9/1994 | Hong et al. | 438/467 |
| 6,627,555 | B2 * | 9/2003 | Eitan et al. | 438/710 |
| 7,772,681 | B2 * | 8/2010 | Joshi et al. | 257/668 |
| 2004/0124545 | A1 * | 7/2004 | Wang | 257/784 |
| 2007/0001278 | A1 * | 1/2007 | Jeon et al. | 257/676 |
| 2008/0305579 | A1 * | 12/2008 | Lin et al. | 438/114 |
| 2009/0165815 | A1 * | 7/2009 | Alcala et al. | 134/1.1 |
| 2013/0157419 | A1 * | 6/2013 | Shimizu et al. | 438/127 |

* cited by examiner

*Primary Examiner* — Kenneth Parker
*Assistant Examiner* — Young W Kim
(74) *Attorney, Agent, or Firm* — Scott B. Stahl

(57) ABSTRACT

Internal nodes of a constituent integrated circuit (IC) package of a multichip module (MCM) are protected from excessive charge during plasma cleaning of the MCM. The protected nodes are coupled to an internal common node of the IC package by respectively associated discharge paths. The common node is connected to a bond pad of the IC package. During MCM assembly, and before plasma cleaning, this bond pad receives a wire bond to a ground bond pad on the MCM substrate.

20 Claims, 3 Drawing Sheets

PROTECTING INTEGRATED CIRCUITS FROM EXCESSIVE CHARGE ACCUMULATION DURING PLASMA CLEANING OF MULTICHIP MODULES

This application claims the priority under 35 U.S.C. §119 (e)(1) of provisional application Ser. No. 61/673,388 filed Jul. 19, 2012 and incorporated herein by reference.

This invention was developed under Contract DE-AC04-94AL85000 between Sandia Corporation and the U.S. Department of Energy, and under Contract DE-NA0000622 between Honeywell Federal Manufacturing 85 Technologies, LLC and the U.S. Department of Energy. The U.S. Government has certain rights in this invention.

FIELD

The present work relates generally to multichip integrated circuit modules and, more particularly, to assembly of such multichip modules (MCMs).

BACKGROUND

Multichip modules are an advanced packaging concept in which multiple integrated circuits (ICs) are directly attached to a substrate such as a multilayer printed circuit board. In a typical implementation, the printed circuit board substrate material is either polymer or ceramic, and the attachment is either by epoxy or by solder.

Once the integrated circuits are physically attached to the substrate, they are electrically connected to the substrate. The most common approach for achieving electrical connection is wire bonding. Wire bonding uses elevated temperature and mechanical force and/or vibration to connect a microscale wire between two bond pads. The wire typically attaches first to a bond pad on the integrated circuit, then to a bond pad on the substrate itself.

In one implementation of the multichip module concept, each integrated circuit is epoxied or soldered into a recessed cavity in the top surface of the substrate. Wire bonds electrically connect the integrated circuits with bond pads provided on the top surface of the substrate.

In the lowest cost and most manufacturable implementation, however, the top surface of the substrate is planar so that the integrated circuits are epoxied or soldered to the same substrate surface on which the bond pads are provided. A drawback to this approach is that the epoxy or solder process introduces contaminants on the substrate surface, particularly on the bond pads, and this degrades wire bond adhesion. Poor wire bond adhesion reduces bond strength during pull testing (see, e.g., MIL-STD-883H), and degrades mechanical reliability and overall assembly yield.

Plasma cleaning may be applied to the module after integrated circuit attachment, to remove the contaminants before wire bonding takes place. This greatly increases the mechanical strength of the wire bonds and process repeatability. However, semiconductor manufacturers strongly discourage the use of plasma cleaning with CMOS integrated circuits and related IC technologies. The problem is that plasma cleaning can induce an accumulation of excessive charge on the surface of an integrated circuit that, in the case of CMOS and related technologies, is harmful to reliability and functionality. Experimental results have demonstrated that excessive charge induced by plasma cleaning may typically be expected to destroy the functionalities of CMOS integrated circuits. This is unfortunate because CMOS (which has been a dominant integrated circuit technology for the last 30 years) is expected to continue its technological dominance for years to come.

It is desirable in view of the foregoing to provide for the application of plasma cleaning to an MCM without producing harmfully excessive charge on its constituent ICs.

DETAILED DESCRIPTION

Figure 1:
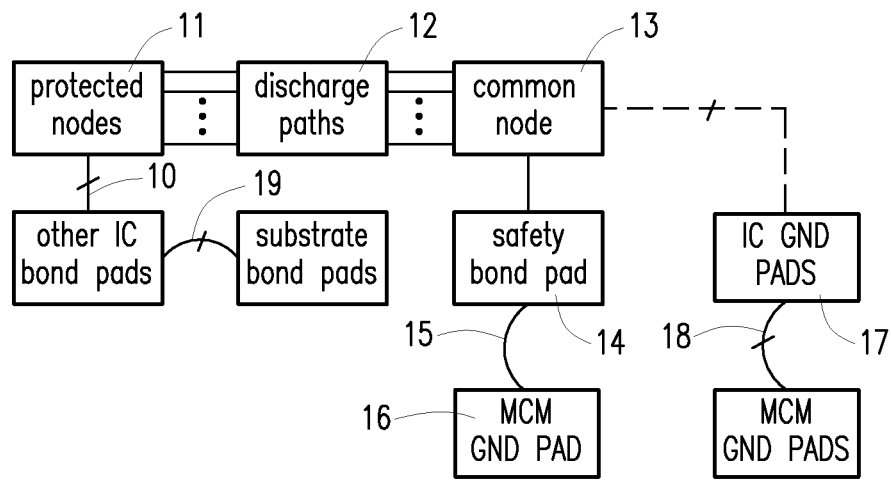
FIG. 1 diagrammatically illustrates an architecture that protects internal nodes within a constituent IC of an MCM during plasma cleaning, and/or while wire bonding the IC, according to example embodiments of the present work.

Example embodiments of the present work allow plasma cleaning/processing of MCMs without producing harmfully excessive charge on internal nodes of the constituent ICs. This favorably affects cost and reliability of solid-state electronics manufacturing. The destructive potential of plasma cleaning is eliminated through a combination of electrical design and micro-assembly procedures.

The process of plasma cleaning causes charge to accumulate on the internal nodes of an integrated circuit. Plasma cleaning becomes destructive when the accumulated charge creates a voltage difference between two internal nodes that exceeds the maximum voltage rating across two terminals of a device connected to those two nodes. If the voltage difference across the two device terminals exceeds the maximum rating across those device terminals, the device could fail destructively.

Prevention of destructive failure during plasma cleaning begins with the electrical design of the integrated circuit itself. The designer should identify all internal nodes of the integrated circuit that are susceptible to over-voltage damage, and electrically connect those nodes (also referred to herein as protected nodes) to an internal common node that will ultimately be connected in turn to an external ground (explained in more detail below). In most cases, a direct electrical connection to the common node (i.e., a short) would degrade circuit performance. Some embodiments electrically couple each protected node to the common node through an associated auxiliary device. As examples, this auxiliary device may be realized as (1) a high resistance path, (2) a high inductance path, or (3) a nonlinear device that is not conductive when the node voltage is within acceptable limits, but is conductive when the node voltage approaches a predetermined voltage limit. Each auxiliary device thus provides a discharge path between the associated protected node and the common node (and thus the aforementioned external ground). For example, a non-linear circuit that implements a suitable diode-like characteristic between the associated protected node and the common node will provide a discharge path that permits the protected node from reaching its associated predetermined voltage limit. In some embodiments, all voltage-sensitive internal nodes as well as all nodes connected to IC bond pads (including power supplies, etc.) are treated as protected nodes, and are thus coupled to the common node via respectively associated discharge paths.

A connection is provided between the internal common node of the IC and an external ground on the substrate of the MCM (also referred to herein as MCM ground). This external ground connection should be in place before plasma cleaning occurs. Without this connection to an external ground, there would be no electrical path to permit excess charge to leave the IC during plasma cleaning The external ground connection is implemented by a "safety wire bond" between a bond pad on the MCM substrate surface and a bond pad of the IC (also referred to herein as a safety bond pad). The substrate bond pad is connected to the MCM ground, and the safety bond pad is connected to the aforementioned internal common node of the IC. Such a safety wire bond is provided with respect to each IC of the MCM before performing plasma cleaning. These safety wire bonds protect all sensitive nodes of all ICs from excessive voltages/charges during plasma cleaning. After plasma cleaning, all remaining wire bonds for all ICs of the MCM are provided. In some embodiments, all wire bonds are standard wire bonds produced in conventional fashion.

In some embodiments, the safety wire bond is made as a "reverse wire bond" that connects first to the MCM ground pad on the substrate, and then to the safety bond pad on the integrated circuit. This is the opposite direction of a standard wire bond that connects first to the integrated circuit bond pad and then to the substrate bond pad. The reverse wire bond for the safety wire protects the integrated circuit from damage due to any undesired electrostatic change on the wire bonding tool, since any such charge is shorted to the MCM ground before contact with the integrated circuit bond pad. Furthermore, the reverse wire bond for the safety wire permits any undesired electrostatic charge on the IC package to be discharged through the bond wire to MCM ground instead of through the wire bonding tool, thus providing a shorter discharge path. In some embodiments, the remaining wire bonds are made after plasma cleaning, and in the normal direction, first connecting to the bond pads of the integrated circuit, and then to the bond pads on the substrate. The normal bonding direction is acceptable here because the bond pads on the integrated circuit, and all internal protected nodes connected thereto, are already coupled (through discharge paths, the internal common node, the safety bond pad and the safety wire bond) to the MCM ground and are thus protected from electrostatic damage during the wire bonding process. Thus, the safety wire bond between the safety bond pad and MCM ground also provides the (heretofore unavailable) advantage of protecting against undesired electrostatic charge during the wire bonding process.

In some embodiments, all ground bond pads of the IC package (i.e., all IC bond pads that are required by the IC functionality to be connected to the MCM ground) are simply connected directly to the internal common node of the IC. In such embodiments, all nodes connected to these IC ground bond pads, which would otherwise be treated as protected nodes, are already connected directly to the internal common node, and thus do not require auxiliary devices to provide discharge paths.

In some embodiments, the wire bonds for the ground pads of the IC package are also provided before plasma cleaning. In some embodiments, reverse wire bonding is used before plasma cleaning for at least one of the safety bond pad and the IC package ground bond pads.

FIG. 1 diagrammatically illustrates an architecture according to example embodiments of the present work for protecting internal nodes of an IC package, as mounted on a substrate of an MCM, from harmfully excessive charges/voltages produced while applying plasma cleaning to the MCM, and/or while wire bonding the IC package. The internal protected nodes shown at 11 are coupled to the internal common node 13 by respectively associated discharge paths shown at 12. Each discharge path at 12 is implemented, for example, by a suitable auxiliary device as described above. The common node 13 is connected to a safety bond pad 14 that has a safety wire bond 15 to an MCM ground bond pad 16 on the substrate. The other remaining IC bond pads are wire bonded at 19 to bond pads on the MCM substrate as shown. The connections shown at 10 between IC bond pads and internal protected nodes reflect that nodes connected to bond pads are treated as protected nodes in some embodiments.

FIG. 1 also shows by broken line the aforementioned alternative where all ground bond pads of the IC (shown at 17) are connected directly to the common node 13. Such embodiments provide the protected nodes of the IC with redundant protection against excessive charge throughout the mission deployment of the IC. The IC ground pads 17 are shown wire bonded at 18 to MCM ground bond pads on the substrate. The wire bonds at 18 will typically be better quality than the wire bond 15, because the wire bond 15 is made before plasma cleaning, while the wire bonds 18 are made after plasma cleaning.

Figure 2:
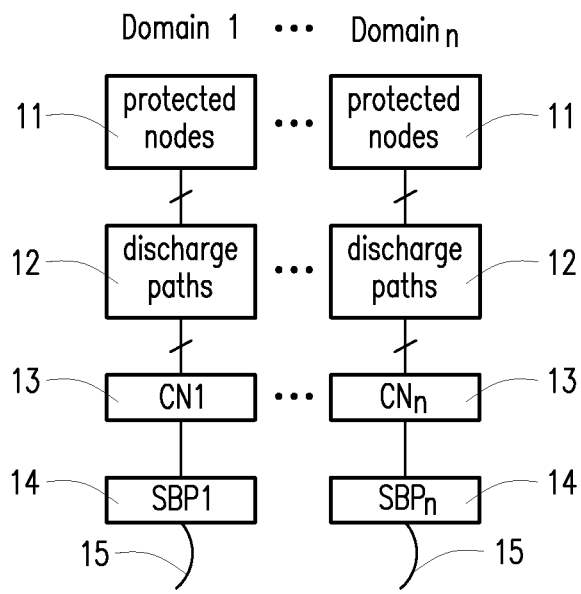
FIG. 2 diagrammatically illustrates an architecture similar to that of FIG. 1 according to example embodiments of the present work, and wherein the IC is partitioned into multiple circuitry domains having respectively corresponding common nodes and safety wire bonds.

Some embodiments provide multiple separate common nodes on a single IC. Each common node receives a safety wire bond to MCM ground before plasma cleaning. The multiple common nodes are respectively associated with multiple circuit domains of the IC, for example, one or more domains containing analog circuitry, and one or more domains containing digital circuitry. An example of this is shown in FIG. 2, where multiple (i.e., n) domains are designated as Domain 1 through Domain n, and the corresponding multiple common nodes are designated as CN1-CNn. The protected nodes 11 of each domain are coupled to the corresponding common node at 13 by respectively associated discharge paths at 12. As also shown in FIG. 2, the n common nodes CN1-CNn are respectively connected to n safety bond pads designated as SBP1-SBPn. Each of the safety bond pads in FIG. 2 receives a safety wire bond 15 to MCM ground in the manner described above.

Figure 3:
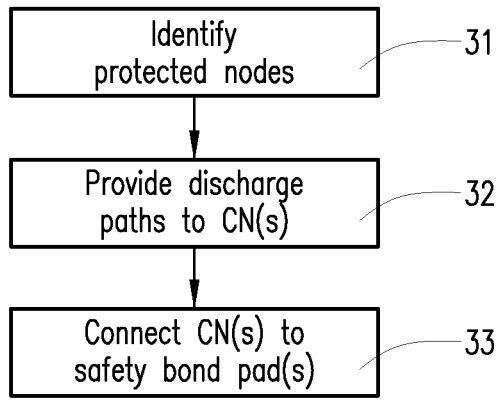
FIG. 3 illustrates operations that may be performed in fabricating an IC according to example embodiments of the present work.

FIG. 3 illustrates operations that may be performed in fabricating an IC package according to example embodiments of the present work. The internal nodes to be protected are identified at 31. Discharge paths from the internal protected nodes to one or more internal common nodes (CN) are provided at 32. At 33, the one or more common nodes are connected to one or more safety bond pads.

Figure 4:
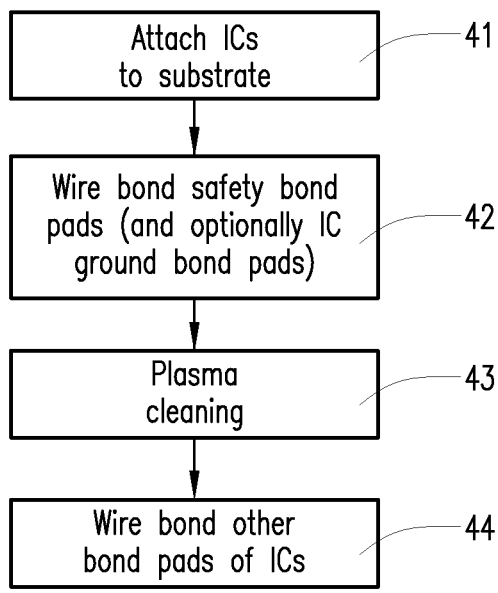
FIG. 4 illustrates MCM assembly operations that may be performed according to example embodiments of the present work.

FIG. 4 illustrates MCM assembly operations that may be performed according to example embodiments of the present work. At 41, the IC packages are attached to the MCM substrate. At 42, wire bonds are provided for the safety bond pads of the IC packages (and for the ground bond pads of the IC packages in some embodiments). In some embodiments, at least one wire bond (per IC package) provided at 42 is a reverse wire bond. Plasma cleaning is performed next at 43, after which the other IC bond pads are wire bonded at 44 to bond pads on the substrate.

Figure 5:
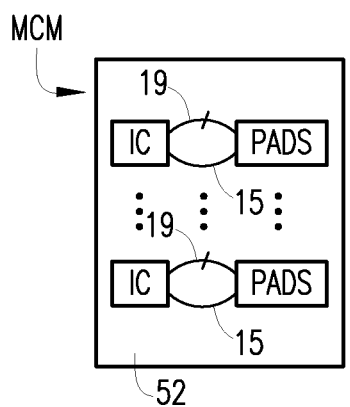
FIG. 5 diagrammatically illustrates an MCM according to example embodiments of the present work, produced using assembly operations such as shown in FIG. 4.

FIG. 5 diagrammatically illustrates an MCM according to example embodiments of the present work. In some embodiments, the MCM of FIG. 5 is produced using assembly operations such as shown in and described relative to FIG. 4. The MCM of FIG. 5 includes a substrate 52 with a plurality of integrated circuit packages mounted thereon. In some embodiments, the substrate 52 is a conventional substrate of the type described above, and the integrated circuit packages are attached to the top substrate surface according to the techniques described above. Each integrated circuit package is safety wire bonded at 15 (see also FIG. 1) to a safety bond pad on substrate 52. Each integrated circuit package also has a plurality of further wire bonds 19 (see also FIG. 1) connecting it to bond pads on the substrate 52.

Some embodiments provide a single chip module having only a single IC package mounted on the substrate 52 and connected to bond pads on the substrate by wire bonds at 15 and 19.

Figure 6:
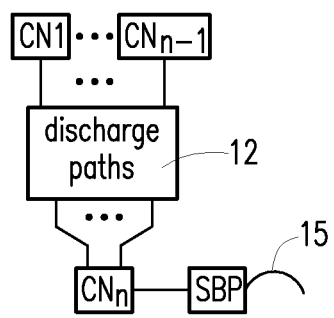
FIGS. 6 and 7 diagrammatically illustrate further example embodiments of the present work wherein the IC is partitioned into multiple circuitry domains having respectively corresponding common nodes.
Figure 7:
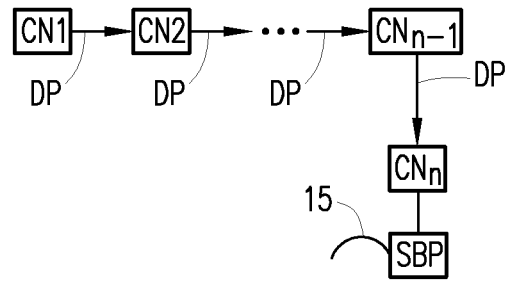

FIGS. 6 and 7 diagrammatically illustrate example embodiments of the present work that have multiple domains and multiple common nodes as in FIG. 2, but require only a single safety bond pad. In the example of FIG. 6, common node CNn of FIG. 2 is connected to a single safety bond pad SBP, and the other common nodes of FIG. 2 (shown as CN1-CNn−1) are coupled to CNn by respective discharge paths as shown at 12 (see also FIGS. 1 and 2). In the example of FIG. 7, the common nodes CN1-CNn of FIG. 2 are coupled by discharge paths (shown diagrammatically at DP) in a series configuration that terminates at CNn, with CNn in turn connected to a single safety bond pad SBP. In various example embodiments, the discharge paths shown in FIGS. 7 and 8 are implemented in the various manners described above. Various embodiments use various combinations of the configurations shown in FIGS. 6 and 7 to couple multiple common nodes to a single safety bond pad.

Although example embodiments of the present work are described above in detail, this does not limit the scope of the present work, which can be practiced in a variety of embodiments.

What is claimed is:

1. A method of assembling a circuit module, comprising:
   mounting on a substrate an integrated circuit package that includes a plurality of bond pads;
   thereafter, wire bonding one of the plurality of bond pads to a first bond pad on the substrate;
   thereafter, applying plasma cleaning to the substrate having the integrated circuit package mounted thereon; and
   thereafter, wire bonding a remainder of the plurality of bond pads to further bond pads on the substrate.

2. The method of claim 1, wherein said mounting, said applying, and each said wire bonding are all performed with respect to a plurality of said integrated circuit packages to assemble a multichip module.

3. The method of claim 1, wherein said wire bonding said one bond pad includes first attaching a bond wire to said first bond pad, and thereafter attaching the bond wire to said one bond pad.

4. The method of claim 1, wherein said first bond pad is a ground pad.

5. The method of claim 4, wherein said one bond pad is connected to an internal common node within the integrated circuit package, and wherein the internal common node is coupled to a plurality of internal protected nodes within the integrated circuit package by a respectively corresponding plurality of discharge paths.

6. The method of claim 5, wherein said wire bonding said one bond pad includes first attaching a bond wire to said first bond pad, and thereafter attaching the bond wire to said one bond pad.

7. The method of claim 5, wherein each said discharge path is one of a high resistance path and a high inductance path.

8. The method of claim 5, wherein each said discharge path is conductive only if the associated protected node reaches an associated predetermined voltage.

9. The method of claim 5, including, before said applying, wire bonding at least a further one of said plurality of bond pads to a bond pad on the substrate.

10. The method of claim 5, wherein at least a further one of said plurality of bond pads is wire bonded to a ground bond pad on the substrate, and wherein said at least a further one of said plurality of bond pads is connected to said common node.

11. The method of claim 1, wherein the substrate is a printed circuit board.

12. The method of claim 1, wherein said mounting includes using one of epoxy and solder to attach the integrated circuit packages to the substrate.

13. The method of claim 1, wherein said integrated circuit package includes a CMOS integrated circuit.

14. A method of fabricating an integrated circuit package, comprising:
   identifying a plurality of internal nodes within the integrated circuit package to be protected from excessive charge during plasma cleaning of a substrate having the integrated circuit package mounted thereon;
   coupling the identified nodes to an internal common node within the integrated circuit package by respectively corresponding discharge paths; and
   connecting the common node to a bond pad of the integrated circuit package.

15. The method of claim 14, including connecting the common node to at least one further bond pad of the integrated circuit package that is required to be grounded for functional operation of the integrated circuit package.

16. The method of claim 14, wherein each said discharge path is one of a high resistance path and a high inductance path.

17. The method of claim 14, wherein each said discharge path is conductive only if the associated protected node reaches an associated predetermined voltage.

18. The method of claim 14, including identifying a plurality of further internal nodes within the integrated circuit package to be protected from excessive charge during plasma cleaning of the substrate having the integrated circuit package mounted thereon, coupling the identified further nodes to a further internal common node within the integrated circuit package by further respectively corresponding discharge paths, and connecting the further common node to a further bond pad of the integrated circuit package.

19. A method of producing a circuit module, comprising:
   identifying a plurality of internal nodes within an integrated circuit package to be protected from excessive charge during plasma cleaning of a substrate having the integrated circuit package mounted thereon;
   coupling the identified nodes to an internal common node within the integrated circuit package by respectively corresponding discharge paths;
   connecting the common node to one of a plurality of bond pads of the integrated circuit package;
   mounting the integrated circuit package on a substrate;

after said mounting, wire bonding said one of the plurality of bond pads to a first bond pad on the substrate;

after said wire bonding, applying plasma cleaning to the substrate having the integrated circuit package mounted thereon; and after said plasma cleaning, wire bonding a remainder of the plurality of bond pads to further bond pads on the substrate.

20. The method of claim 19, wherein said identifying, said coupling, said connecting, said mounting, said applying, and each said wire bonding are all performed with respect to a plurality of said integrated circuits to produce a multichip module.

* * * * *